United States Patent

Kim et al.

(10) Patent No.: US 10,108,771 B2
(45) Date of Patent: Oct. 23, 2018

(54) METHOD, APPARATUS AND SYSTEM FOR FORMING RECOLORABLE STANDARD CELLS WITH TRIPLE PATTERNED METAL LAYER STRUCTURES

(71) Applicant: GLOBALFOUNDRIES INC., Grand Cayman (KY)

(72) Inventors: Juhan Kim, Santa Clara, CA (US); Mahbub Rashed, Sunnyvale, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/140,183

(22) Filed: Apr. 27, 2016

(65) Prior Publication Data

US 2017/0316140 A1  Nov. 2, 2017

(51) Int. Cl.
*H01L 27/02* (2006.01)
*G06F 17/50* (2006.01)
*H01L 27/118* (2006.01)

(52) U.S. Cl.
CPC ...... *G06F 17/5072* (2013.01); *H01L 27/0207* (2013.01); *H01L 27/11807* (2013.01); *H01L 2027/11881* (2013.01)

(58) Field of Classification Search
CPC .... G06F 17/50; G06F 17/507; G06F 17/5072; H01L 27/02; H01L 27/02; H01L 27/0207; H01L 23/53; H01L 23/535

USPC ......................................................... 257/384
See application file for complete search history.

(56) References Cited

U.S. PATENT DOCUMENTS

| | | | |
|---|---|---|---|
| 8,607,172 B2 | 12/2013 | Lu et al. | |
| 8,621,398 B2 | 12/2013 | Shen et al. | |
| 2007/0228419 A1 | 10/2007 | Komaki et al. | |
| 2013/0074029 A1 | 3/2013 | Blatchford et al. | |
| 2013/0086536 A1 | 4/2013 | Kim et al. | |
| 2016/0370699 A1* | 12/2016 | Chen | G03F 7/70433 |

* cited by examiner

*Primary Examiner* — Monica D Harrison
(74) *Attorney, Agent, or Firm* — Williams Morgan, P.C.

(57) ABSTRACT

At least one method, apparatus and system disclosed herein for forming a semiconductor device comprising a plurality of cells having metal features formed using triple patterning processes. An overall pattern layout is created for a first cell that is to be manufactured using a triple patterning process for forming a plurality of metal features on a metal layer. A first color metal feature is formed in the metal layer. The first color metal feature is associated with a first patterning process of the triple patterning process. A second color metal feature is formed in the metal layer. The second color metal feature is associated with a second patterning process of the triple patterning process. A third color metal feature is formed in the metal layer. The third color metal feature is associated with a third patterning process of the triple patterning process. At least one of the first, second, and third color metal features is re-colorable.

21 Claims, 6 Drawing Sheets

METHOD, APPARATUS AND SYSTEM FOR FORMING RECOLORABLE STANDARD CELLS WITH TRIPLE PATTERNED METAL LAYER STRUCTURES

BACKGROUND OF THE INVENTION

Field of the Invention

Generally, the present disclosure relates to the manufacture of sophisticated semiconductor devices, and, more specifically, to various methods providing standard cells that have recolorable structures using triple patterning processes.

Description of the Related Art

There have been many advancements in the area of manufacturing of semiconductor devices. Various processes are performed on semiconductor substrates in manufacturing integrated circuit products. Photolithography is one of the basic processes used in manufacturing integrated circuit products. Generally, photolithography involves: (1) forming a layer of light or radiation-sensitive material, such as photoresist, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching and/or ion implantation processes, may then be performed on the underlying layer of material or substrate through the patterned mask layer.

The ultimate goal in integrated circuit fabrication is to accurately reproduce the original circuit design on the integrated circuit product. Historically, the feature sizes and pitches employed in integrated circuit products were such that a desired pattern could be formed using a single patterned photoresist masking layer. However, in recent years, device dimensions and pitches have been reduced to the point where existing photolithography tools, e.g., 193 nm wavelength immersion photolithography tools, cannot form a single patterned mask layer with all of the features of the overall target pattern. Accordingly, device designers have resorted to techniques that involve performing multiple exposures to define a single target pattern in a layer of material. One such technique is generally referred to as multiple patterning, e.g., double patterning. Generally speaking, double patterning is an exposure method that involves splitting (i.e., dividing or separating) a dense overall target circuit pattern into two separate, less-dense patterns. The simplified, less-dense patterns are then printed separately on a wafer utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively lowers the complexity of the photolithography process, improving the achievable resolution and enabling the printing of far smaller features than would otherwise be impossible using existing photolithography tools.

When designing a layout of various devices with an integrated circuits (e.g., CMOS logic architecture), designers often select pre-designed functional cells comprising various features (e.g., diffusion regions, transistors, metal lines, vias, etc.) and place them strategically to provide an active area of an integrated circuit. One challenge of designing a layout is accommodating ever-increasing density of cell components and still maintain routability for connecting various components of the cells. This is increasingly a challenge as dimensions of these components get smaller, such as for 10 nm or lower integrated circuit designs.

FIG. 1 illustrates a stylized depiction of a typical standard cell. A standard cell 100, which may provide one of various functionalities, may be used to place and design an integrated circuit. The cell 100 of FIG. 1 includes an M1 metal layer that is used for form a $1^{st}$ power rail 101 for use as a Vdd source. The M1 metal layer is also used to form a $2^{nd}$ power rail 102 for use as Vss source. The cell 100 also includes a plurality of internal M1 features 103. Further, a V0 via layer may be used to form one or more vias 104 that connect the M1 formations 101, 102, 103 to other layers of the cell 100.

The $1^{st}$ and $2^{nd}$ power rails 101, 102 are generally formed perpendicular relative to one or more gates of transistors (not shown) in the cell 100. Also, the $1^{st}$ and $2^{nd}$ power rails 101, 102 may be formed such that they overlap with at least one intermediate contact layer structure (not shown), generally formed as a metallic line structure. The metal layer structures are formed using single-patterning or double-patterning process.

Generally, single-patterning processes may be used to form structures in 28 nm node or older designs. As mentioned above, double-patterned metal layer structures are used in 20 nm and 14 nm node designs. There is a desire in the industry to decrease the dimensions of cell components for smaller designs, such as, such as for 10 nm or lower integrated circuit designs.

FIG. 2 illustrates a stylized depiction of another typical standard cell having double-patterned features. A standard cell 200, which may provide one of various functionality, may be used to place and design an integrated circuit. The cell 200 of FIG. 2 includes an M1 metal layer that is used for form a $1^{st}$ power rail 201 for use as a Vdd source. The M1 metal layer is also used to form a $2^{nd}$ power rail 203 for use as Vss source. The $1^{st}$ and $2^{nd}$ power rails 201, 203 may include tooth shaped portions 205. The cell 200 also includes a plurality of internal M1 features 202. Further, a V0 via layer may be used to form one or more vias 204 that connect the M1 formations 201, 202, 203 to other layers of the cell 200.

The cell 200 may be placed adjacent to a $1^{st}$ adjacent cell 215 and a $2^{nd}$ adjacent cell 217. The double-patterning process described above may produce a plurality of double-patterned metal layer structures while avoiding conflicts with the forming of different patterns of adjacent cells 215, 217 that are formed during the double patterning process. However, the standard cell 200, along with the adjacent cells 215, 217 may not be properly formed using double-patterning in more dense-node designs, such as 10 nm and smaller designs. In such as case various "color" conflicts, for example, may occur, as described further below.

In double-patterning processes, the metal features that are formed are typically referred to as either "mandrel-metal" features ("MM") or "non-mandrel-metal" features ("NMM"). As it relates to terminology, the MM features and NMM features are referred to as being different "colors" when it comes to decomposing an overall pattern layout that is intended to be manufactured using a double-patterning process. Thus, two MM features are said to be of the "same color" and two NMM features are said to be of the "same color," while an MM feature and an NMM feature are said to be of "different colors." In some cases different photoresist masks used to respectively different lithography processes may each refer to a different color.

To use double patterning techniques, an overall pattern layout for a circuit must be what is referred to as double patterning compliant. Double patterning compliant generally refers to an overall pattern layout being decomposed into two separate patterns, such that each may be formed using existing photolithography tools and other techniques. One well-known double patterning technique is referred to as LELE ("litho-etch-litho-etch) double patterning. As the name implies, the LELE process involves forming two photoresist etch masks and performing two etching processes to transfer the desired overall pattern to a hard mask layer that is then used as an etch mask to etch an underlying layer of material. With respect to terminology, the different masks employed in the LELE double patterning process are said to be different "colors." Thus, depending upon the spacing between adjacent features, the features may be formed using the same photoresist mask ("same color") or they may have to be formed using different photoresist masks ("different color"). In an LELE process, if two adjacent features are spaced apart by a distance that can be patterned using traditional single exposure photolithography, then those two adjacent features may be formed using the same ("same color") photoresist mask. In contrast, if the spacing between the two adjacent features is less than can be formed using single exposure photolithography, then those features must be either formed using different photoresist masks ("different color") or the spacing between the features must be increased by changing the circuit layout such that they may be formed using the same photoresist mask.

Various rules that define color conflicts may make it difficult to produce cells with decreased dimensions, such as for 10 nm or lower integrated circuit designs. Therefore, a need exists for a method, apparatus, and/or system for providing standard cell layouts of smaller dimensions and custom layout with improved lithographic printability.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming a semiconductor device comprising a plurality of cells having metal features formed using triple patterning processes. An overall pattern layout is created for a first cell that is to be manufactured using a triple patterning process for forming a plurality of metal features on a metal layer. A first color metal feature is formed in the metal layer. The first color metal feature is associated with a first patterning process of the triple patterning process. A second color metal feature is formed in the metal layer. The second color metal feature is associated with a second patterning process of the triple patterning process. A third color metal feature is formed in the metal layer. The third color metal feature is associated with a third patterning process of the triple patterning process. At least one of the first, second, and third color metal features is re-colorable.

BRIEF DESCRIPTION OF THE DRAWINGS

The disclosure may be understood by reference to the following description taken in conjunction with the accompanying drawings, in which like reference numerals identify like elements, and in which.

Figure 1:
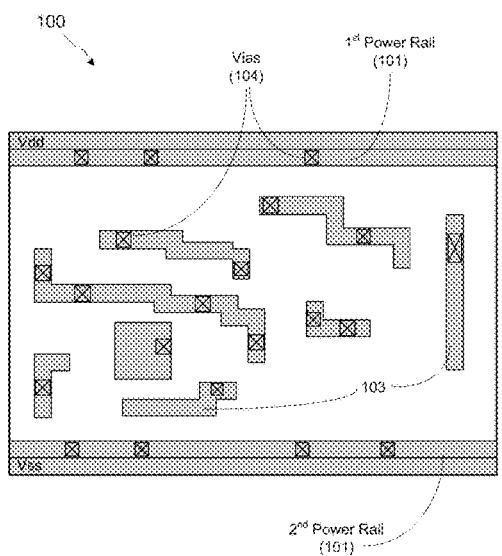
FIG. 1 illustrates a stylized depiction of a typical standard cell.
Figure 2:
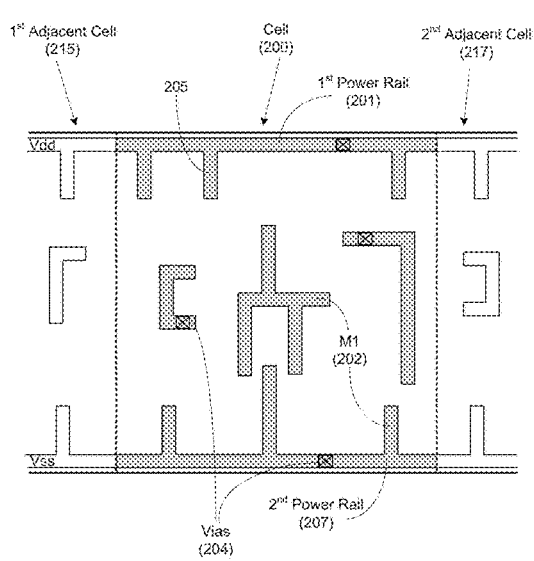
FIG. 2 illustrates a stylized depiction of a typical standard cell having double-patterned features.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein present disclosure is generally directed to various methods of creating circuit layouts that are to be formed using triple-patterning techniques. As will be readily apparent to those skilled in the art upon a complete reading of the present application, the methods and devices disclosed herein may be employed in the fabrication of a variety of devices, such as logic devices, memory devices, ASICs, etc. With reference to the attached figures, various illustrative embodiments of the methods, devices and systems disclosed herein will now be described in more detail.

Embodiments herein provide for performing a triple pattern lithography process for forming metal structures on a metal layer, e.g., Metal 1 (M1) layer. Metal structures formed using a 1st patterning process may be used to produce one or more metal structures of a $1^{st}$ color. Similarly, metal structures formed using a $2^{nd}$ patterning process may be used to produce one or more metal structures of a $2^{nd}$ color, and a $3^{rd}$ patterning process may be used to produce one or more metal structures of a $3^{rd}$ color. The triple patterning process may comprise performing an LELELE process.

In some embodiments, a first mask may be used to perform a first process associated with the triple patterning process; a second mask may be used to perform a second process associated with the triple patterning process; and a third mask may be used to perform a third process associated with the triple patterning process. The first, second and third masks may be provided to a mask manufacturer for forming the masks. The masks may be provided to a semiconductor processing entity to perform the triple patterning process for providing standard cells comprising $1^{st}$, $2^{nd}$, and $3^{rd}$ color metal features provided by embodiments herein.

Embodiments herein provide for a standard cell that comprises metal layers whose color-definition may be changed. For example, a color-conflict or a design rule violation may be detected when at least two cells are arranged into an integrated circuit. Upon such a detection, the color definition of one or more of the metal structure may be changed to reduce the possibility of a color conflict. In some embodiments, when cells are placed into a design, a color conflict check may be automatically performed. If a color conflict is detected, a re-coloring process may be automatically performed to re-color one or more metal structures in the cells to reduce the occurrence of the color conflict.

Figure 3:
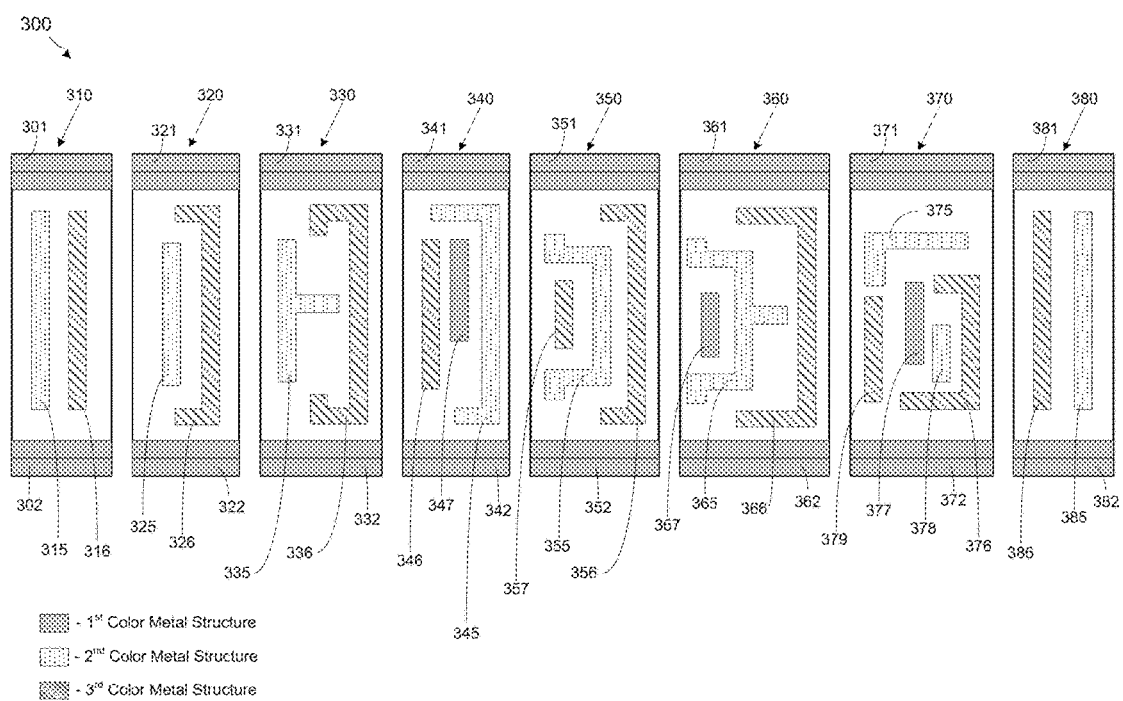
FIG. 3 illustrates, a stylized depiction of a plurality of cells having triple pattern metal features, in accordance with embodiments herein.

Turning now to FIG. 3, a stylized depiction of a plurality of cells having triple pattern metal features, in accordance with embodiments herein, is illustrated. FIG. 3 illustrates an exemplary layout 300 of a plurality of functional or standard cells that comprise metal structures formed from triple patterned lithography process, respectively representing three different "colors," providing a set of $1^{st}$ color metal structure, a set of $2^{nd}$ color metal structures, and a set of $3^{rd}$ color metal structures.

In one embodiment, metal features formed using the $1^{st}$ color are generally used for power rail structures. The metal features formed using the $2^{nd}$ and $3^{rd}$ colors are generally used as internal metal structures/nodes. In this manner the probability of violating coloring conflict rules are reduced. In some cases, the $1^{st}$ color metal structures may be used as internal metal nodes using small geometry. This is performed to conform to "same-color" spacing rules in instances where "different-color" space rule is narrower. Although, the metal features in the layout 300 is described in terms of M1 metal layer, those skilled in the art having benefit of the present disclosure would appreciate that the concepts described herein may also apply to metal features of other metal layers (e.g., M0 and/or M2 metal layers).

A $1^{st}$ type of cell 310 comprises M1 metal features 301 and 302 of a $1^{st}$ color. The $1^{st}$ color M1 feature 301 is formed to provide a $1^{st}$ power rail for a Vdd voltage signal. The $1^{st}$ color M1 feature 302 is formed to provide a $2^{nd}$ power rail for a Vss voltage signal. The cell 310 also comprises a horizontal, internal $2^{nd}$ color rectangular metal (M1) feature 315. The cell 310 also comprises a horizontal, internal $3^{rd}$ color rectangular metal (M1) feature 316. The placement of the metal features associated with the three colors is performed to attempt to conform to "same-color" and "different-color" spacing rules.

A $2^{nd}$ type of cell 320 comprises M1 metal features 321 and 322 of a $1^{st}$ color. The $1^{st}$ color M1 feature 321 is formed to provide a $1^{st}$ power rail for a Vdd voltage signal. The $1^{st}$ color M1 feature 322 is formed to provide a $2^{nd}$ power rail for a Vss voltage signal. The cell 320 also comprises a horizontal, internal $2^{nd}$ color rectangular metal (M1) feature 325. The cell 320 also comprises an internal $3^{rd}$ color C-shaped metal (M1) feature 326. The C-shaped metal feature 326 partially encloses the horizontal $2^{nd}$ color rectangular metal feature 325. In one embodiment, C-shaped structures may be useful in configuring a layout to avoid same color conflict, particularly where a power rail is configured with a different color and is proximate to a metal feature in a side-to-side configuration.

A $3^{rd}$ type of cell 330 comprises M1 features 331 and 322 of a $1^{st}$ color. The $1^{st}$ color M1 feature 331 is formed to provide a $1^{st}$ power rail for a Vdd voltage signal. The $1^{st}$ color M1 feature 332 is formed to provide a $2^{nd}$ power rail for a Vss voltage signal. The cell 320 also comprises an internal polygonal $2^{nd}$ color rectangular metal (M1) feature 335. The cell 330 also comprises an internal $3^{rd}$ color C-shaped metal (M1) feature 336. The C-shaped metal feature 336 partially encloses the polygonal $2^{nd}$ color rectangular metal feature 335.

A $4^{th}$ type of cell 340 comprises M1 features 341 and 342 of a $1^{st}$ color. The $1^{st}$ color M1 feature 341 is formed to provide a $1^{st}$ power rail for a Vdd voltage signal. The $1^{st}$ color M1 feature 342 is formed to provide a $2^{nd}$ power rail for a Vss voltage signal. The cell 340 also comprises an internal C-shaped $2^{nd}$ color metal (M1) feature 345. The cell 340 also comprises an internal $3^{rd}$ color horizontal metal (M1) feature 346. The cell 340 also comprises an internal $1^{st}$ color horizontal metal (M1) feature 347. The C-shaped metal feature 345 partially encloses the metal features 346 and 347. The internal $1^{st}$ color horizontal metal (M1) feature 347 is positioned sufficiently far away from the power rails to avoid same-color conflicts.

A $5^{th}$ type of cell 350 comprises M1 features 351 and 352 of a $1^{st}$ color. The $1^{st}$ color M1 feature 351 is formed to provide a $1^{st}$ power rail for a Vdd voltage signal, and the $1^{st}$ color M1 feature 352 is formed to provide a $2^{nd}$ power rail for a Vss voltage signal. The cell 350 also comprises an internal C-shaped $2^{nd}$ color metal (M1) feature 355, wherein a polygon-shape portion is formed at the end of each of the sides of the C-shaped feature 355. The cell 350 also comprises an internal $3^{rd}$ color C-shaped metal (M1) feature 356. The cell 340 also comprises a smaller internal $3^{rd}$ color horizontal metal (M1) feature 357. The C-shaped metal feature 355 partially encloses the metal feature 357, while the C-shaped metal feature 356 partially overlaps the metal feature 355.

A $6^{th}$ type of cell 360 comprises M1 features 361 and 362 of a $1^{st}$ color. The $1^{st}$ color M1 feature 361 is formed to provide a $1^{st}$ power rail for a Vdd voltage signal, and the $1^{st}$ color M1 feature 362 is formed to provide a $2^{nd}$ power rail for a Vss voltage signal. The cell 360 also comprises an internal C-shaped $2^{nd}$ color metal (M1) feature 365, wherein a polygon-shape portion is formed at the end of each of the sides, and at the center of the "C" of the C-shaped feature 365. The cell 360 also comprises an internal $3^{rd}$ color C-shaped metal (M1) feature 366. The cell 340 also comprises a smaller internal $1^{st}$ color horizontal metal (M1) feature 367. The C-shaped metal feature 365 partially encloses the metal feature 365.

A $7^{th}$ type of cell 370 comprises M1 features 371 and 372 of a $1^{st}$ color. The $1^{st}$ color M1 feature 371 is formed to provide a $1^{st}$ power rail for a Vdd voltage signal, and the $1^{st}$ color M1 feature 372 is formed to provide a $2^{nd}$ power rail for a Vss voltage signal. The cell 370 also comprises an internal, rotated L-shaped $2^{nd}$ color metal (M1) feature 375. The cell 370 also comprises an internal $3^{rd}$ color C-shaped metal (M1) feature 376. The cell 340 also comprises an internal $1^{4}$ color horizontal metal (M1) feature 377. A $2^{nd}$ color horizontal feature 378 and a $3^{rd}$ color horizontal feature 379 are also formed in the cell 370. The C-shaped metal feature 376 partially encloses the metal feature 378.

Finally, in FIG. 3, an $8^{th}$ type of cell 380 comprises M1 features 381 and 382 of a $1^{st}$ color. The $1^{st}$ color M1 feature 381 is formed to provide a $1^{st}$ power rail for a Vdd voltage signal, and the $1^{st}$ color M1 feature 382 is formed to provide a $2^{nd}$ power rail for a Vss voltage signal. The cell 380 also comprises a horizontal, internal $2^{nd}$ color rectangular metal (M1) feature 385. The cell 310 also comprises a horizontal, internal $3^{rd}$ color rectangular metal (M1) feature 386.

The placement of the various metal features in the layout 300 associated with the three colors are performed to conform to "same-color" and "different-color" spacing rules. Since a triple patterned lithography process is performed to form metal features of three colors in a single metal layer, the metal features may be formed closer together without violating spacing rules.

Generally, each of the cells of FIG. 3 utilizes the $1^{st}$ color for power rails, while metal features associated with the $2^{nd}$ and $3^{rd}$ colors are formed as internal metal nodes. In some cases, metal features associated with the $1^{st}$ color may be formed near the middle of the cells as to avoid same coloring conflicts with the power rails, which are also associated with the $1^{st}$ color. Therefore, each cell of FIG. 3 has no coloring conflict. Accordingly, using techniques described herein, smaller and/or denser cells may be formed. This could result in small integrated circuit devices.

Figure 4:
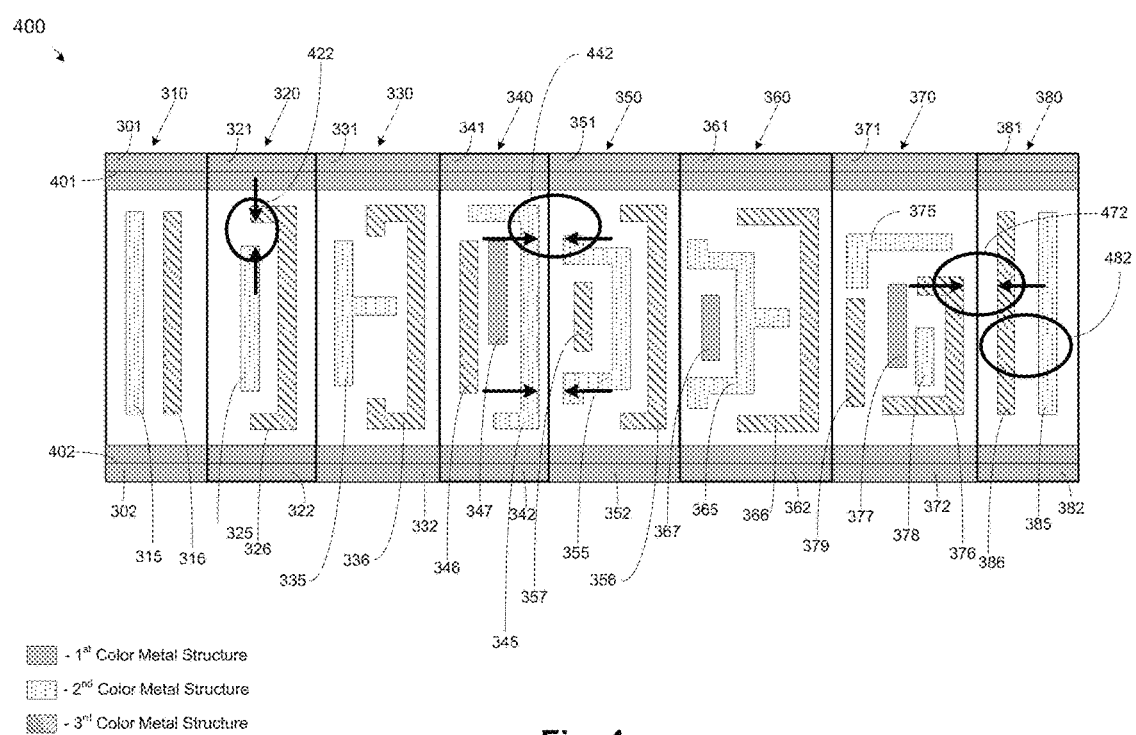
FIG. 4 illustrates a stylized depiction of exemplary layout using standard cells, in accordance with embodiments herein.

Turning now to FIG. 4, a stylized depiction of exemplary layout using the standard cells of FIG. 3, in accordance with embodiments herein, is illustrated. In one embodiment, the standard cells of FIG. 3 may be placed in a layout 400. In this embodiment, the cells 310, 320, 330, 340, 350, 360, 370, and 380 (collectively "310-380") may be placed adjacently as shown in FIG. 4.

In one embodiment, the cells (310-380) are connected together such that a Vdd power rail 401 of the layout 400 is connected to the $1^{st}$ color M1 Vdd features of the each of the cells (310-380). A Vss power rail 402 of the layout 400 is connected to the $1^{st}$ color M1 Vss features of the each of the cells (310-380).

Upon placement of the cells to form an integrated circuit, one or more color-spacing errors may occur. For example, if "same-color" or "different-color" (side-to-side, tip-to-tip, or tip-side) spacing is not adequate, a coloring conflict between the two cells may occur, such as a conflict between cell 340 and the cell 350 may occur. As indicated by the circle 442, when the cells (310-380) are placed adjacently as indicated in FIG. 4, a potential for a same-color conflict between the $2^{nd}$ color metal formation 345 and the $2^{nd}$ color metal formation 355 may exist. Therefore, an automated check may be performed to determine if there is a color conflict between the cell 340 and the cell 350.

In one embodiment, an automated check of the spacing indicated by the circle 442 may be performed. As shown in FIG. 4, the $2^{nd}$ color metal formation 345 faces the $2^{nd}$ color metal formation 355. An exemplary color conflict rule may dictate that the same-color tip-to-side space must be equal or greater than the space of the different color tip-to-side space. Therefore, the spacing between the metal formations 345 and 355 may be compared to either a predetermined threshold spacing, or to the spacing indicated by the circle 422, showing the "different-color" tip-to-side spacing between the $2^{nd}$ color M1 feature 325 and the $3^{rd}$ color M1 feature 326 of cell 320. In this example, the same-color tip-to-side spacing (circle 442) may not be greater than the spacing of the different color tip-to-side spacing (circle 422). Therefore, the automated check may indicate that the there is a color conflict between cells 340 and 350.

Similarly, an automated check of the spacing indicated by the circles 472 and 482 may be performed. As shown in FIG. 4, the $3^{rd}$ color metal formation 376 faces the $3^{rd}$ color metal formation 386. A predetermined color conflict rule may dictate that the same-color side-to-side spacing must be equal or greater than the spacing of the different color side-to-side spacing. Therefore, the spacing between the metal formations 376 and 386 may be compared to either a predetermined threshold spacing, or to the spacing indicated by the circle 482, showing the "different-color" side-to-side spacing between the $3^{rd}$ color M1 feature 386 and the $2^{nd}$ color M1 feature 385 of cell 380. In this example, the same-color side-to-side spacing (circle 472) may not be greater than the spacing of the different color side-to-side spacing (circle 482). Therefore, the automated check may indicate that the there is a color conflict between cells 370 and 380.

Figure 5:
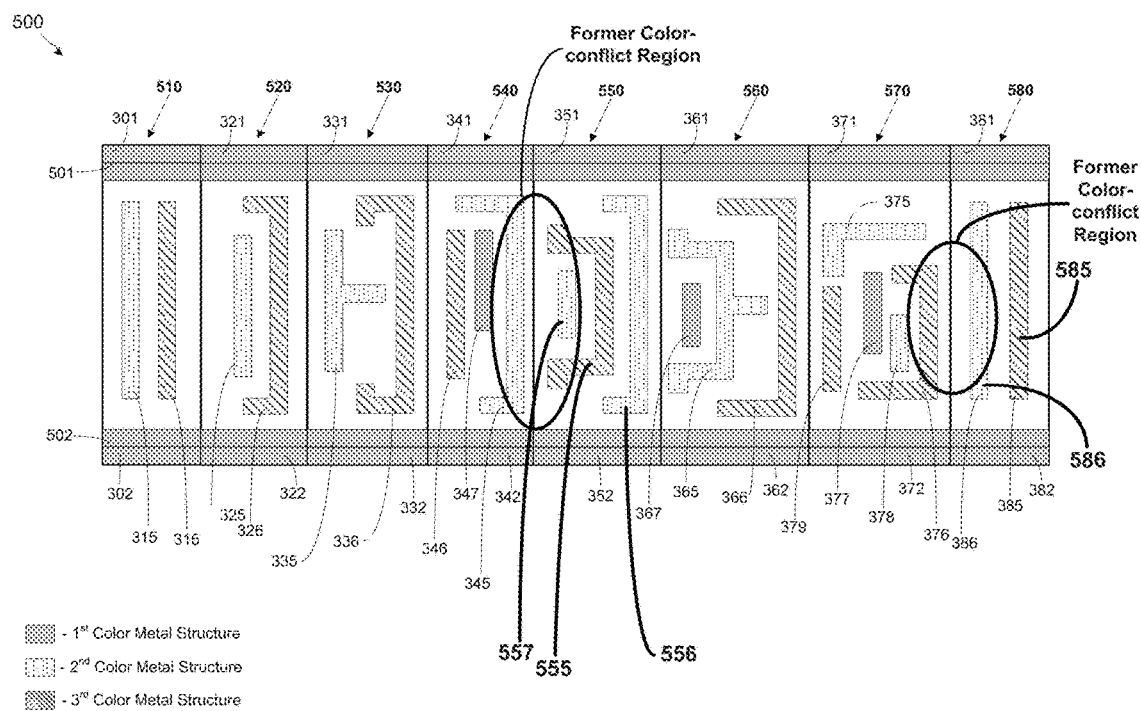
FIG. 5 illustrates a stylized depiction of a layout having cells that comprise re-colored metal features, in accordance with embodiments herein.

In accordance with embodiments herein, coloring conflicts may be avoided by re-coloring one or more metal features in one or more cells. As noted above, the cells 310-380 are configured such that metal features in the cells 310-380 may be re-colorable. In order to address the coloring conflicts between cells 340 and 350, the metal features of cell 350 may be re-colored. Similarly, in order to address the coloring conflicts between cells 370 and 380, the metal features of cell 380 may be re-colored, as illustrated in FIG. 5 and accompanying description below. In some embodiments, one or more of the color metal features are allowed to be re-colorable, while other color metal features are not re-colorable, i.e., fixed.

Turning now to FIG. 5, a stylized depiction of a layout having cells that comprise re-colored metal features, in accordance with embodiments herein is provided. A number of cells are placed adjacently to form an integrated circuit. The cells 510, 520, 530, 540, 550, 560, 570, and 580 (collectively "510-580") are respectively similar to the cells 310-380. However, cells 550 and 580 are re-coloring versions of cells 350 and 380, respectively, wherein the metal features in cells 550 and 580 are re-colored to avoid coloring conflicts. In this embodiment, the cells collectively "510-580" may be placed adjacently as shown in FIG. 5.

In one embodiment, the cells (510-580) are connected together such that a Vdd power rail 501 of the layout 500 is connected to the $1^{st}$ color M1 Vdd features of the each of the cells (510-580). A Vss power rail 502 of the layout 500 is connected to the $1^{st}$ color M1 Vss features of the each of the cells (510-580).

As shown in FIG. 5, cell 550 is similar to cell 350 of FIG. 4, except that the metal features of cell 350 have been re-colored. The internal C-shaped $2^{nd}$ color metal (M1) feature 355 of FIG. 4 has been re-colored as a $3^{rd}$ color metal feature 555 in FIG. 5. The internal $3^{rd}$ color C-shaped metal (M1) feature 356 of FIG. 4 has been re-colored as a $2^{nd}$ color metal feature 556 in FIG. 5. Further, the smaller internal $3^{rd}$ color horizontal metal (M1) feature 357 has been re-colored as a $2^{nd}$ color metal feature 557 in cell 550 of FIG. 5. In this manner, the metal features of cell 550 have been re-colorized, as compared to corresponding cell 350 of FIG. 4. The modified metal features are emphasized in FIG. 5 by bold reference numbers.

As a result of the re-colorizing of the metal features of cell 550 of FIG. 5, the former coloring conflict that existed in the corresponding location in FIG. 4 (see circle 542 of FIG. 5) is avoided. Due to the re-coloring of cell 550, the same-color conflict between the $2^{nd}$ color metal formation 345 and the $2^{nd}$ color metal formation 355 (of FIG. 4) is avoided since the $2^{nd}$ color metal formation 355 has been re-colored as a $3^{rd}$ color metal feature 555. Therefore, the tip-to-side spacing conflict of FIG. 4 is avoided in FIG. 5.

Also as shown in FIG. 5, cell 580 is similar to cell 380 of FIG. 4, except that the metal features of cell 380 have been re-colored. The horizontal, internal $2^{nd}$ color rectangular metal (M1) feature 385 of FIG. 4 has been re-colored as a $3^{rd}$ color metal feature 585 in FIG. 5. The horizontal, internal $3^{rd}$ color rectangular metal (M1) feature 386 of FIG. 4 has been re-colored as a $2^{nd}$ color metal feature 586 in FIG. 5. In this manner, the metal features of cell 580 have been re-colorized, as compared to corresponding cell 350 of FIG. 4.

As a result of the re-colorizing of the metal features of cell 580 of FIG. 5, the former coloring conflict that existed in the corresponding location in FIG. 4 (see circle 582 of FIG. 5), is avoided. Due to the re-coloring of cell 580, the same-color conflict between the $3^{rd}$ color metal formation 386 and the $3^{rd}$ color metal formation 385 (of FIG. 4) is avoided since the $3^{rd}$ color metal formation 385 has been re-colored as a $3^{rd}$ color metal feature 585. Therefore, the side-to-side spacing conflict of cell 370-380 FIG. 4, is avoided in FIG. 5. Using the concepts exemplified in embodiments herein, a number of re-coloring processes may be performed automatically to reduce the possibility of coloring conflicts.

Figure 6:
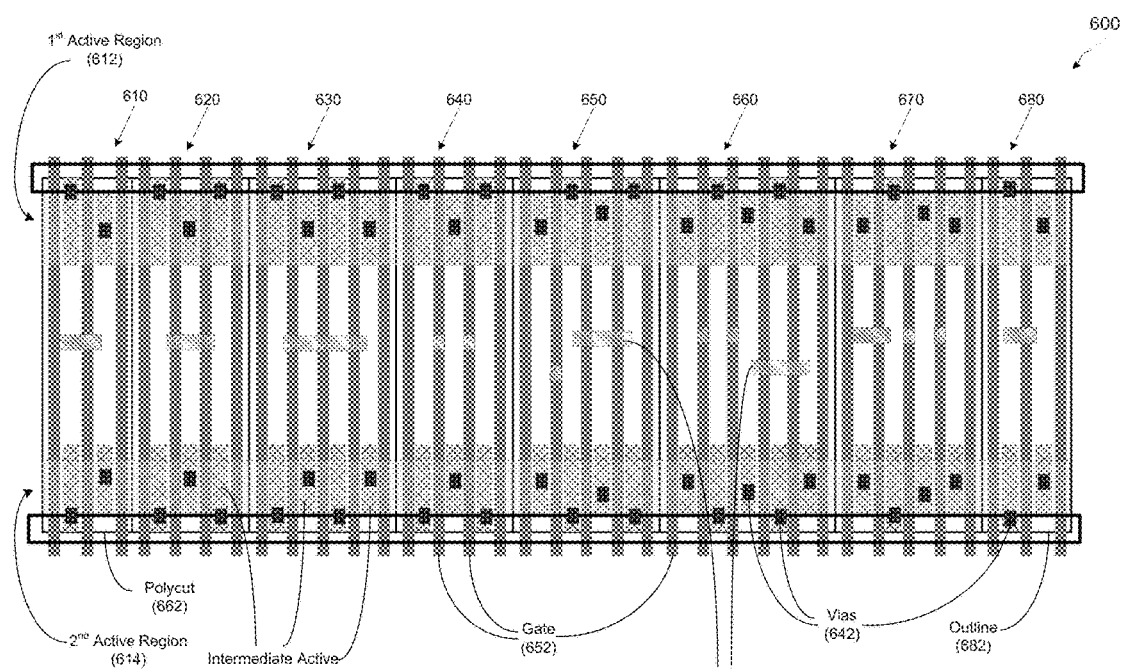
FIG. 6 illustrates a stylized depiction of a layout comprising base layers and standard cells, in accordance with embodiments herein.

Turning now to FIG. 6, a stylized depiction of a layout comprising base layers and standard cells, in accordance with embodiments herein, is illustrated. In one embodiment, the circuit layout 600 comprises cells 610, 620, 630, 640, 650, 660, 670, and 680 (collectively "610-680"). In one embodiment, the cells 610-380 are the same as the cells 310-380 of FIG. 4. In another embodiment, the cells 610-380 are the same as the cells 510-580 of FIG. 5.

The cells 610-680 comprise a $1^{st}$ active region 612 and a $2^{nd}$ active region 614. The $1^{st}$ and $2^{nd}$ active regions 612, 614 may be used to form transistor devices. The $1^{st}$ and $2^{nd}$ active regions 612, 614 may define various transistor components, such as gate formations (poly gate regions) 652 for forming transistors. A plurality of polycut layers 662 may be formed for cutting the outer portions of the gate formations 652.

The layout 600 also comprises a plurality of intermediate active contact formations 632 for connecting various formations to the $1^{st}$ and $2^{nd}$ active regions 612, 614. The layout 600 also comprises a plurality of intermediate gate contact formations 672 for connecting various cell formations to the gate formations 652. Moreover, a plurality of vias 642 may be formed in a via 0 layer for interconnecting various metal formations in the layout 600. An outline layer 682 may be formed to provide a marker feature for the layout 600. The intermediate active contact formations 632 and the intermediate gate contact formations 672 are local metallic layers and are defined as intermediate contact layers (e.g., CA, CB formations). The intermediate contact layers, or middle layers, are formed between the transistor layer and the via 0 layer.

In one embodiment, after designing/forming the layout 600, an automated check for coloring conflicts may be performed. In one example, the cells 610-680 may be designed similar to the cells 310-380 of FIG. 4; however, after automated design re-colorization, the cells 610-680 be automatically modified (i.e., re-colored), which would result in the cells 610-680 being similar to the re-colorized cells 510-580 of FIG. 5.

The re-colorable standard cells provided by embodiments herein reduces metal-1 patterning issues as cells become smaller (e.g., 10 nm or smaller) and/or denser. Using the re-colorable features provided herein, coloring conflicts that otherwise would have caused expenditure of area in standard cells, are reduced. Thus, chip-level saving in area may be achieved using embodiments herein. The re-colorable features provided by embodiments herein provide for scaling standard cells to smaller dimensions.

Figure 7:
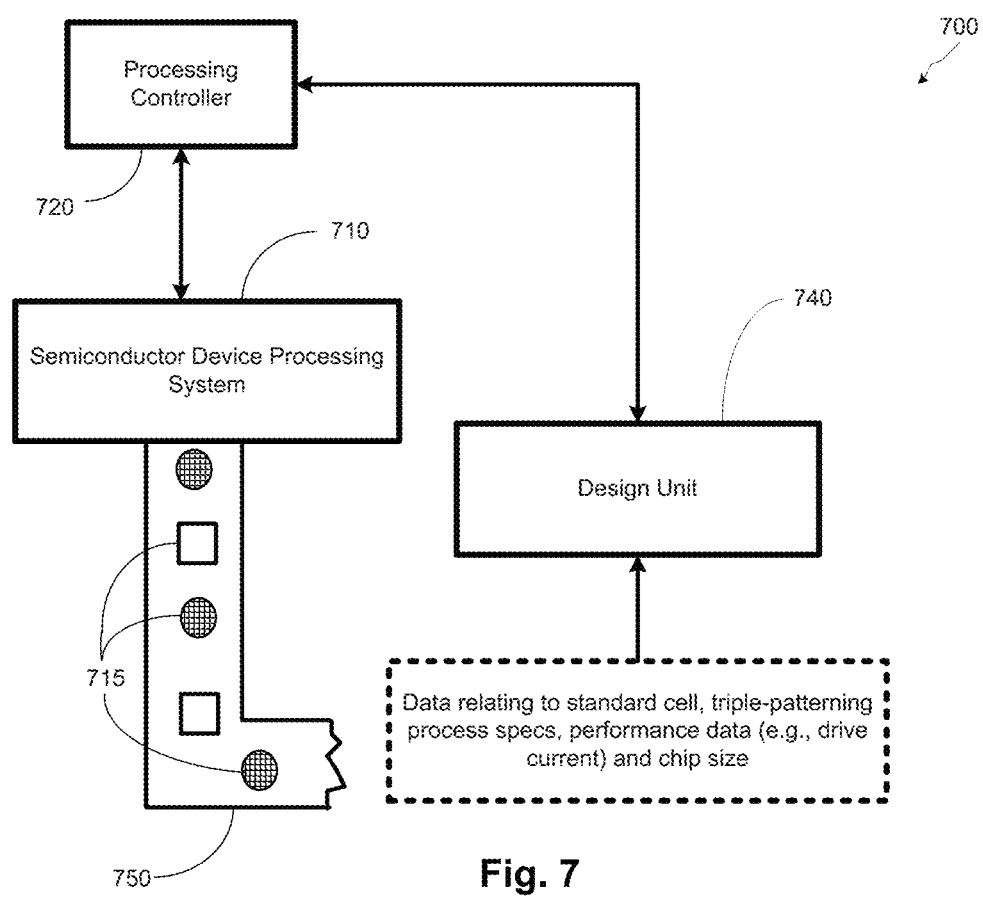
FIG. 7 illustrates a stylized depiction of a system for fabricating a semiconductor device package comprising standard cells having re-colorable metal features, in accordance with embodiments herein.

Turning now to FIG. 7, a stylized depiction of a system for fabricating a semiconductor device package comprising standard cells having re-colorable metal features, in accordance with embodiments herein, is illustrated. The system 700 of FIG. 7 may comprise a semiconductor device processing system 710 and a design unit 740. The semiconductor device processing system 710 may manufacture integrated circuit devices based upon one or more designs provided by the design unit 740.

The semiconductor device processing system 710 may comprise various processing stations, such as etch process stations, photolithography process stations, CMP process stations, etc. One or more of the processing steps performed by the processing system 710 may be controlled by the processing controller 720. The processing controller 720 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 710 may produce integrated circuits on a medium, such as silicon wafers. More particularly, the semiconductor device processing system 710 produce integrated circuits based on standard cells comprising re-colorable metal features.

The production of integrated circuits by the device processing system 710 may be based upon the circuit designs provided by the design unit 740. The processing system 710 may provide processed integrated circuits/devices 715 on a transport mechanism 750, such as a conveyor system. In some embodiments, the conveyor system may be sophisticated clean room transport systems that are capable of transporting semiconductor wafers. In one embodiment, the semiconductor device processing system 710 may comprise a plurality of processing steps, e.g., the $1^{st}$ process step, the $2^{nd}$ process set, etc., as described above.

In some embodiments, the items labeled "715" may represent individual wafers, and in other embodiments, the items 715 may represent a group of semiconductor wafers, e.g., a "lot" of semiconductor wafers. The integrated circuit or device 715 may be a transistor, a capacitor, a resistor, a memory cell, a processor, and/or the like. In one embodiment, the device 715 is a transistor and the dielectric layer is a gate insulation layer for the transistor.

The design unit 740 of the system 700 is capable of providing a circuit design that may be manufactured by the semiconductor processing system 710. The design unit 740 may receive various types of data including standard cell specifications, triple-pattern process specifications, performance data, device specification, etc. Using such data, the design unit 740 may provide various process definitions based on the data that includes standard cell specifications, triple-pattern process specifications, performance data, device specification, etc. Based upon such details of the devices, the integrated circuit design unit 740 may determine placement and use of standard cells. The design unit 740 may also perform a coloring conflict check to determine whether there are any potential coloring conflicts in the layout. Upon a detection of such potential coloring conflicts, one or more re-coloring process may be performed, such as the re-coloring process described by embodiments herein. Based upon these specifications, the integrated circuit design unit 740 may provide data for manufacturing a semiconductor device package described herein.

The system 700 may be capable of performing analysis and manufacturing of various products involving various technologies. For example, the system 700 may design and production data for manufacturing devices of CMOS technology, Flash technology, BiCMOS technology, power devices, memory devices (e.g., DRAM devices), NAND memory devices, and/or various other semiconductor technologies.

Embodiments herein may provide for various technical solutions to technical problems associated with semiconductor device designing, processing, and manufacturing. Using the triple patterning designs and/or the re-colorable features described herein, reduced area of standard cell layouts, as well as reduced area-usage of integrated circuit layout. Further, improved lithographic printing related to device fabrication. Embodiments herein may be utilized in various industrial applications, such as microprocessors, smart phones, mobile phones, cellular handsets, set-top boxes, DVD recorders and players, automotive navigation, printers and peripherals, networking and telecom equipment, gaming systems, and digital cameras. Accordingly, embodiments herein are applicable to various types of highly integrated semiconductor devices, such as integrated circuits involving 10 nm or smaller applications.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
creating an overall pattern layout for a first cell that is to be manufactured using a triple patterning process for forming a plurality of metal features on a metal layer, wherein the layout comprises a first color metal feature in said metal layer, wherein said first color metal feature is associated with a first patterning process of said triple patterning process, a second color metal feature in said metal layer, wherein said second color metal feature is associated with a second patterning process of said triple patterning process, and a third color metal feature in said metal layer, wherein said third color metal feature is associated with a third patterning process of said triple patterning process;
providing at least one color conflict rule regarding a spacing between two features of the same color relative to a spacing between two features of different colors;
detecting a color conflict between (i) a color metal feature selected from at least one of said first color metal feature, said second color metal feature, or said third color metal feature and (ii) another metal feature of said layout if said at least one color conflict rule is violated; and
recoloring at least said color metal feature in response to detecting said color conflict wherein at least said color metal feature is assigned to a different color associated with a different patterning process of said triple patterning process.

2. The method of claim 1, further comprising:
providing a first mask for forming said first color metal feature in said metal layer;
providing a second mask for forming said second color metal feature in said metal layer; and
providing a third mask for forming said third color metal feature in said metal layer.

3. The method of claim 2, further comprising:
providing data relating to said first, second, and third sets of mask data to a mask manufacturer; and
manufacturing integrated circuit products using masks obtained from said mask manufacturer, wherein said masks were based upon said first, second, and third sets of mask data.

4. The method of claim 1, wherein:
providing said first color metal feature comprises providing a Vdd power rail structure and a Vss power rail structure of said cell;
providing said second color metal feature comprises providing a first internal structure of said cell; and
providing said third color metal feature comprises providing a second internal structure of said cell.

5. The method of claim 4, further comprising:
providing a plurality of gate structures for defining at least one transistor;
providing a silicide structure for connecting to a portion of said transistor;
providing a local intermediate contact layer operatively coupling to said silicide feature; and
providing a plurality of vias for operatively coupling to said local intermediate contact layer.

6. The method of claim 5, further comprising providing an electrical connection between at least one of said power rails and said transistor through at least one of said vias, said local intermediate contract layer, and said silicide structure.

7. The method of claim 1, wherein:
    detecting said color conflict comprises determining whether said at least one color conflict rule is violated if said first cell is placed adjacent to a second cell in a layout; and
    recoloring said color metal feature comprises assigning at least one of said second color metal feature or said third color metal feature to a different color associated with a different patterning process of said triple patterning process in response to a determination that said coloring conflict rule is violated.

8. The method of claim 7, further comprising fixing said first color metal feature as non-recolorable.

9. The method of claim 7, wherein said third color metal feature is used as a power rail and the color definition of said first color metal feature is exchangeable with said second color metal feature, and said third color metal feature is non-recolorable.

10. The method of claim 1, wherein:
    providing said first color metal feature comprises providing a plurality of rectangular shaped power rail structures;
    providing said second color metal feature comprises providing a C-shaped internal metal structure; and
    providing said third color metal feature comprises providing a horizontal internal metal structure.

11. A semiconductor device design, comprising:
    a plurality of cells each comprising:
        at least one first color metal feature in a metal layer, wherein said first color metal feature is to be formed using a first patterning process of a triple patterning process;
        at least one second color metal feature in said metal layer, wherein said second color metal feature is to be formed using a second patterning process of said triple patterning process; and
        at least one third color metal feature in said metal layer, wherein said third color metal feature is to be formed using a third patterning process of said triple patterning process; and
    wherein at least one of said first, second, and third color metal features is capable of being formed using a different patterning process of said triple patterning process if at least one color conflict rule regarding a spacing between two features of the same color relative to a spacing between two features of different colors is violated.

12. The semiconductor device design of claim 11, wherein said cells each comprise a Vdd power rail and a Vss power rail both formed from said first color metal features, wherein said Vdd power rails of the cells are electrically coupled and said Vss power rails of the cells are electrically coupled.

13. The semiconductor device design of claim 12, wherein:
    a first one of said plurality of cells comprises:
        a first rectangular metal feature comprised of said second color metal feature; and
        a second rectangular metal feature comprised of said third color metal feature;
    a second one of said plurality of cells comprises:
        a first rectangular metal feature comprised of said third color metal feature; and
        a first C-shaped metal feature comprised of said second color metal feature, wherein said C-shaped metal feature partially encloses said first rectangular metal feature;
    a third one of said plurality of cells comprises:
        a first polygonal metal feature comprised of said second color metal feature; and
        a second C-shaped metal feature comprised of said third color metal feature, wherein said C-shaped metal feature partially encloses said first polygonal metal feature; and
    a fourth one of said plurality of cells comprises:
        a second rectangular metal feature comprised of said first color metal feature
        a second polygonal metal feature comprised of said second color metal feature; and
        a third C-shaped metal feature comprised of said third color metal feature, wherein said C-shaped metal feature partially encloses said second polygonal metal feature.

14. The semiconductor device design of claim 13, wherein said cells each comprise a Vdd power rail and a Vss power rail both formed from said second color metal features, and wherein said first color metal feature is exchangeable with said third color metal feature, and said second color metal feature is non-recolorable.

15. The semiconductor device design of claim 11, wherein said plurality of cells are configured such that at least one of said first, second and third color metal feature can be re-colored.

16. The semiconductor device design of claim 11, wherein said cells each comprise a Vdd power rail and a Vss power rail both formed from said third color metal features, and wherein said first color metal feature is exchangeable with said second color metal feature, and said third color metal feature is non-recolorable.

17. The semiconductor device design of claim 16, wherein each of said cells comprises:
    a plurality of gate structures for defining at least one transistor;
    a silicide structure for connecting to a portion of said transistor;
    a local intermediate contact layer operatively coupling to said silicide feature; and
    providing a plurality of vias for operatively coupling to said local intermediate contact layer; and
    wherein an electrical connection is provided between at least one of said power rails and said transistor through at least one of said vias, said local intermediate contract layer, and said silicide structure.

18. A system, comprising:
    a semiconductor device processing system to manufacture a semiconductor device comprising a plurality of cells; and
    a processing controller operatively coupled to said semiconductor device processing system, said processing controller configured to control an operation of said semiconductor device processing system to manufacture said semiconductor device, wherein a design for manufacture of said semiconductor device comprising:
    a plurality of cells each comprising:
        at least one first color metal feature in a metal layer, wherein said first color metal feature is to be formed using a first patterning process of a triple patterning process;
        at least one second color metal feature in said metal layer, wherein said second color metal feature is to be formed using a second patterning process of said triple patterning process; and at least one third color metal feature in said metal layer, wherein said third color metal feature is to be formed using a third patterning process of said triple patterning process; and wherein at least one of said first, second, and third color metal features is capable of being formed using a different patterning process of said triple patterning process if at least one color conflict rule regarding a spacing between two features of the same color relative to a spacing between two features of different colors is violated.

19. The system of claim 18, further comprising a design unit configured to generate a design comprising a definition for said plurality of cells, said design unit also configured to:

determine whether a predetermined coloring conflict rule would be violated if a first one of said plurality of cells is placed adjacent to a second one of said plurality of cells in a layout; and perform a re-coloring process to re-color at least one of said second color metal feature or said third color metal feature in response to a determination that said coloring conflict rule would be violated.

20. The system of claim 18, wherein each of said cells comprises:

a plurality of gate structures for defining at least one transistor;

a silicide structure for connecting to a portion of said transistor;

a local intermediate contact layer operatively coupling to said silicide feature; and providing a plurality of vias for operatively coupling to said local intermediate contact layer; and wherein an electrical connection is provided between at least one of said power rails and said transistor through at least one of said vias, said local intermediate contract layer, and said silicide structure.

21. The system of claim 18, wherein said first color metal feature comprises a plurality of rectangular shaped power rail structures; said second color metal feature comprises a C-shaped internal metal structure; and said third color metal feature comprises a horizontal internal metal structure.

* * * * *